US009606188B2

(12) United States Patent
Noda et al.

(10) Patent No.: US 9,606,188 B2
(45) Date of Patent: Mar. 28, 2017

(54) MEASUREMENT SYSTEM

(71) Applicant: MAKITA CORPORATION, Anjo-shi, Aichi (JP)

(72) Inventors: Masafumi Noda, Anjo (JP); Hitoshi Suzuki, Anjo (JP); Masaaki Fukumoto, Anjo (JP); Takuya Umemura, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 744 days.

(21) Appl. No.: 13/939,485

(22) Filed: Jul. 11, 2013

(65) Prior Publication Data

US 2014/0019074 A1    Jan. 16, 2014

(30) Foreign Application Priority Data

Jul. 12, 2012  (JP) ................................ 2012-156592

(51) Int. Cl.
*G01R 31/36* (2006.01)
*H02J 7/00* (2006.01)

(52) U.S. Cl.
CPC ..... *G01R 31/3648* (2013.01); *G01R 31/3606* (2013.01); *H02J 7/0004* (2013.01)

(58) Field of Classification Search
CPC ........................... H02J 7/0029; G01R 31/3606
(Continued)

(56) References Cited

U.S. PATENT DOCUMENTS 6,804,100 B2 * 10/2004 Astala .................. H02J 7/0029
                                                         320/134
2003/0193318 A1   10/2003 Ozawa et al.
(Continued)

FOREIGN PATENT DOCUMENTS

JP        H08-149707 A      6/1996
JP        2000-194456 A     7/2000
(Continued)

OTHER PUBLICATIONS

Jan. 5, 2016 Office Action issued in Japanese Patent Application No. 2012-156592.
(Continued)

*Primary Examiner* — Alexander Satanovsky
*Assistant Examiner* — Felix Suarez
(74) *Attorney, Agent, or Firm* — Oliff PLC (57) ABSTRACT

A measurement system according to one aspect of the present invention includes a battery pack and at least one type of connected device to which the pack is connected. The pack includes a first detection device detecting a predetermined physical quantity in the pack and having a predetermined measurement range. The connected device includes a second detection device detecting a physical quantity the same as the predetermined physical quantity and having a measurement range different from the range of the first detection device. One of the pack and the connected device includes a receiving device and a measurement processing device that performs a predetermined measurement process by using one of: a detection-value-related information received by the receiving device; and a detection result by one device of the first detection device and the second detection device, the one device being provided in one of the pack and the connected device.

7 Claims, 7 Drawing Sheets

(58) Field of Classification Search
USPC ...... 702/58, 63, 81, 104, 108, 183; 320/118, 320/134
See application file for complete search history.

(56) References Cited

U.S. PATENT DOCUMENTS

| | | |
|---|---|---|
| 2006/0017444 A1 | 1/2006 | Fechalos et al. |
| 2007/0108940 A1 | 5/2007 | Sainomoto et al. |
| 2008/0309285 A1 | 12/2008 | Choksi et al. |
| 2010/0213900 A1 | 8/2010 | Carrier et al. |
| 2011/0012560 A1* | 1/2011 | Sakakibara ......... H01M 10/441 320/118 |
| 2011/0254508 A1 | 10/2011 | Sakakibara |
| 2012/0037385 A1 | 2/2012 | Suzuki et al. |

FOREIGN PATENT DOCUMENTS

| | | |
|---|---|---|
| JP | B2-3225119 | 11/2001 |
| JP | 2003-307555 A | 10/2003 |
| JP | A-2010-164322 | 7/2010 |
| JP | 2011-130528 A | 6/2011 |
| WO | 2004/034074 A1 | 4/2004 |

OTHER PUBLICATIONS

Jul. 21, 2016 Search Report issued in European Patent Application No. 13176122.3.

* cited by examiner

MEASUREMENT SYSTEM

CROSS-REFERENCE TO RELATED APPLICATIONS

This application claims the benefit of Japanese Patent Application No. 2012-156592 filed on Jul. 12, 2012 in the Japan Patent Office, the disclosure of which is incorporated herein by reference.

BACKGROUND

The present invention relates to a measurement system that measures a physical quantity in a battery pack.

There has been a known battery pack that contains a rechargeable battery and includes a function of calculating a remaining battery capacity of the rechargeable battery. The remaining battery capacity calculated by the battery pack can be used for various purposes; for example, in an electric power tool to which this battery pack is attached and which is operated by electric power from the rechargeable battery, the calculated remaining battery capacity is used to display the remaining battery capacity of the rechargeable battery in a simplified manner.

There have been known various methods of calculating a remaining battery capacity of a rechargeable battery. For example, Unexamined Japanese Patent Application Publication No. 2010-164322 discloses the following technique: a value of a discharge current is detected by an electric current detection unit provided inside assembled cells; the detected value is successively integrated so as to calculate a value of a discharge capacity; the value of the discharge capacity is deducted from a value of a capacity in a fully-charged state, thereby calculating a value of the remaining battery capacity.

Moreover, Japanese Patent No. 3225119 discloses the following technique: in a battery pack, an electric-current detection resistor that detects a value of a charge current and a value of a discharge current from a rechargeable battery is provided; both of a time-integrated value of the detected value of the charge current and a time-integrated value of the detected value of the discharge current are added or deducted, thereby calculating a value of the remaining battery capacity. By taking into account both of the discharge and charge in the above-described manner, the remaining battery capacity can be more accurately calculated.

SUMMARY

However, in a battery pack for an electric power tool, there may be a case where a value of a charge current is, for example, around 10 A at a maximum, while a value of a discharge current exceeds, for example, 100 A at a maximum, and therefore, the value of the charge current is greatly different from the value of the discharge current. For this reason, if it is intended to detect both of the value of the charge current and the value of the discharge current by the same single electric-current detection unit provided inside the battery pack, this electric-current detection unit essentially needs to be configured to be capable of measuring an electric current value up to around 100 A. Therefore, as the electric current value becomes lower, an error of the detection becomes greater. Consequently, it is difficult to accurately calculate the remaining battery capacity.

Even when focusing only on the discharge current, the value of the discharge current may be high, for example, exceed 100 A, or may be low, for example, 10 A or below, and dependent on an operation state of the electric power tool. Thus, a fluctuation range of the value of the discharge current is greater. Therefore, as the value of the discharge current during operation is lower, an accuracy of the detection becomes low, causing a greater detection error. As a result, it becomes difficult to accurately calculate the remaining battery capacity.

The aforementioned problem in calculating the remaining battery capacity in the battery pack is one example, and the same problem as the aforementioned problem may occur when other detection objects (physical quantities) are detected by a detection device. Specifically, it is necessary to configure such that, as a range of a physical quantity as a detection object is greater, the detection device is capable of detecting a value up to a maximum value within the range. Thus, the lower a detection value is, the lower the detection accuracy becomes.

As above, in one aspect of the present invention, it is preferable that a physical quantity can be detected with high accuracy by using a simple configuration, regardless of a range of the physical quantity as a detection object.

One aspect of the present invention is a measurement system provided with a battery pack containing a battery, and at least one type of connected device to which the battery pack is to be connected. The battery pack includes a first detection device that is configured to detect a predetermined physical quantity in the battery pack and that has a predetermined measurement range. The at least one type of connected device includes a second detection device that is configured to detect a physical quantity and that has a measurement range different from the measurement range of the first detection device, the physical quantity being the same as the predetermined physical quantity. One of the battery pack and the at least one type of connected device is a first device, and the other of the battery pack and the at least one type of connected device is a second device. The first device includes a receiving device and a measurement processing device. The receiving device is configured to receive a detection-value-related information that is transmitted from the second device and that directly or indirectly indicates a detection result by one of the first detection device and the second detection device. The measurement processing device is configured to perform a predetermined measurement process by using one of: the detection-value-related information received by the receiving device; and a detection result by one device of the first detection device and the second detection device, the one device being provided in the first device. The second device includes a transmission device configured to transmit the detection-value-related information to the first device. Here, the measurement range means a maximum value of a physical quantity in a measurement range (detection range) that can be normally detected by the first detection device and the second detection device.

In the above-constituted measurement system of the present invention, the battery pack and the at least one type of connected device are provided with the respective detection devices for detection of the same physical quantity. Although these detection devices detect the same physical quantity as a detection object, the detection devices have different respective measurement ranges from each other. Therefore, if the physical quantity is great, this physical quantity can be accurately detected by the detection device having the higher measurement range. On the other hand, if the physical quantity is small, this physical quantity can be accurately detected by the detection device having the lower measurement range.

Moreover, to the measurement processing device, the detection result by the detection device in the first device provided with this measurement processing device is transmitted. In addition, the detection result (detection-value-related information) by the detection device in the second device is transmitted to the measurement processing device from the second device. Thereby, the measurement processing device can easily obtain both of the detection results by the detection devices having the different measurement ranges.

Thus, the measurement system of the present invention makes it possible to highly-accurately detect a physical quantity as a detection object by a simple configuration, regardless of a range of the physical quantity.

The first detection device and the second detection device may detect any physical quantity as a detection object. For example, the first detection device and the second detection device may be configured to detect an electric current to be discharged from the battery or to be charged to the battery, as the physical quantity.

In this case, the electric current is detected by the different measurement ranges, respectively, of the first detection device and the second detection device. Accordingly, by performing the measurement process with the detection result of each of the detection devices, it is possible to perform the measurement process with high accuracy.

If the physical quantity as the detection object is an electric current, the first detection device may be configured to detect a value of the electric current in a predetermined first measurement range, and the second detection device may be configured to detect a value of the electric current in a predetermined second measurement range lower than the first measurement range.

In the measurement system configured as above, in a case of an electric current having a relatively large value, the detection result by the first detection device is adopted, while in a case of an electric current having a relatively small value, the detection result by the second detection device is adopted. Thereby, even if a variation range of the electric current is great, the measurement processing device can obtain an electric current value (or information indicating the electric current value) with high accuracy to perform the measurement process.

In the above-constituted measurement system, various devices can be considered as the at least one type of connected device. For example, a battery charger that charges the battery may be provided as the at least one type of connected device. In this system in which the battery pack and the battery charger are connected to each other, the measurement processing device may be configured to perform; during discharging of the battery, the measurement process by using a detection result by the first detection device, and during charging of the battery by the battery charger, the measurement process by using a detection result by the second detection device.

That is to say, comparing a discharge current when the battery pack is connected to another connected device and an electric power of the battery is consumed by the another connected device, with a charge current when the battery is charged by the battery charger, in general, the discharge current is usually, relatively greater than the charge current, although it depends on a consumed electric power of the another connected device.

In view of the above, during discharge of the battery, the detection result by the first detection device provided in the battery pack is used, while during charge of the battery from the battery charger, the detection result by the second detection device provided in the battery charger is used. Thereby, even if there is a greater difference between the discharge current and the charge current, the measurement processing device can obtain an electric current value (or information indicating the electric current value) with high accuracy to perform the measurement process.

Moreover, in the system in which the battery pack and the battery charger are connected to each other in the above-described manner, the battery pack may include the receiving device and the measurement processing device. The battery charger may include the transmission device. The measurement processing device may be configured to perform, as the measurement process, calculation of a remaining battery capacity of the battery.

In the above-constituted measurement system, the measurement processing device provided in the battery pack obtains information indicating a charge current at a time of charge, from the battery charger. Therefore, even if a value of the charge current is small, it is possible to obtain highly accurate information of the charge current detected in the battery charger. For this reason, when calculating a remaining battery capacity of the battery, the remaining battery capacity during charge can be calculated with high accuracy, thereby improving accuracy of the calculation as a whole of the remaining battery capacity.

As the at least one type of connected device, for example, an electric device to be operated by an electric power of the battery may be provided. In the system in which the battery pack and the battery charger are connected to each other in the above-described manner, the battery pack may include the receiving device and the measurement processing device. The electric device may include the transmission device. The measurement processing device may be configured such that, when the detection-value-related information is received from the electric device, the measurement processing device performs the measurement process by using the detection-value-related information received from the electric device, and when the detection-value-related information is not received from the electric device, the measurement processing device performs the measurement process by using a detection result of the first detection device.

As explained above, the measurement processing device provided in the battery pack generally uses the detection result by the detection device provided in the battery pack (the first detection device), and also uses, if the detection-value-related information is received from the electric device, the received detection-value-related information. With this configuration, it is also possible to obtain the discharge current during discharge to the electric device, with high accuracy.

Such a configuration is especially effective in a case where the value of the discharge current is a small value with respect to the measurement range provided in the battery pack, such as when a rated power of the electric device is small or when the electric device is operated under light load. Moreover, in such a case, if the measurement processing device is configured to perform, as the measurement process, calculation of a remaining battery capacity of the battery, it is possible to obtain even the discharge current having a small value with high accuracy so as to reflect the obtained discharge current in the calculation of the remaining battery capacity. Therefore, an improved accuracy of the calculation of the remaining battery capacity can be achieved.

Furthermore, if the physical quantity as a detection object is an electric current, the transmission device may transmit information directly indicating the detected electric current value. However, the transmission device may transmit, for example, a result of time-integration of (integrating) the electric current value, as information indirectly indicating the electric current value.

That is to say, the second device may include an electric-current integration device configured to calculate an electric-current integration value by performing a time-integration of a value of an electric current detected by one of the first detection device and the second detection device, the one being provided in the second device. In this case, the transmission device is configured to transmit the electric-current integration value calculated by the electric-current integration device, as the detection-value-related information.

As explained above, the measurement system is configured to perform, as the measurement process, a process using the electric-current integration value, not by transmitting the detection result, as it is, of an electric current, but by transmitting the detection result as the electric-current integration value. In this case, a calculation load in the measurement process can be reduced. Moreover, if the electric-current integration value in the second device is intended to be calculated in the first device, it is necessary to obtain the electric current value from the second device in a relatively short cycle (i.e., receive the electric current value that has been transmitted from the second device) and perform time-integration of the obtained electric current value. This causes a very frequent communication between the battery pack and the connected device.

In this regard, if the electric-current integration value is transmitted to a receiving-side device, the receiving-side device does not need to perform time-integration of the electric current value. Thus, the frequency of the communication can be reduced.

Moreover, the above-described calculation of the remaining battery capacity can be performed based on a result of a time integration of the electric current value. Therefore, if it is configured such that calculation of the remaining battery capacity is performed as the measurement process, the electric-current integration value is transmitted as the detection-value-related information; this configuration is more effective in terms of both load in the measurement process and load in the communication.

BRIEF DESCRIPTION OF THE DRAWINGS

The invention will now be described below, by way of example, with reference to the accompanying drawings, in which.

DETAILED DESCRIPTION OF THE PREFERRED EMBODIMENTS

The present embodiment is an embodiment in which the present invention is applied to calculation of a remaining battery capacity of a battery in a battery pack of an electric power tool.

Figure 1:
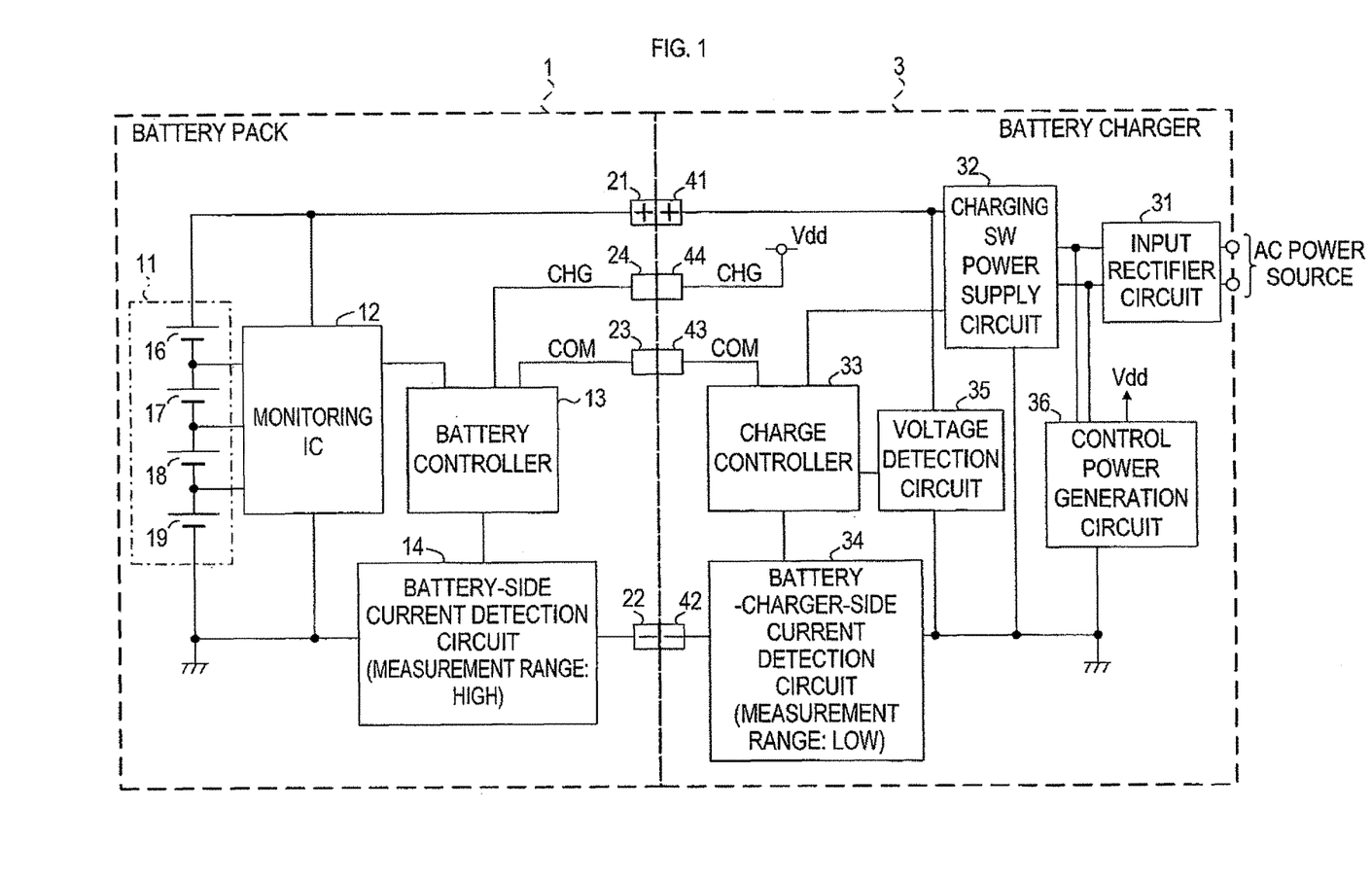
FIG. 1 is a configuration diagram showing a schematic configuration of a battery pack and a battery charger of the present embodiment.

As shown in FIG. 1, a battery pack 1 contains a battery (rechargeable battery) 11. When being connected to a battery charger 3, the battery pack 1 is configured to be able to charge the battery 11 from the battery charger 3. FIG. 1 shows a state where the battery pack 1 is attached to the battery charger 3 thereby to electrically connect the battery pack 1 and the battery charger 3 to each other.

Figure 2:
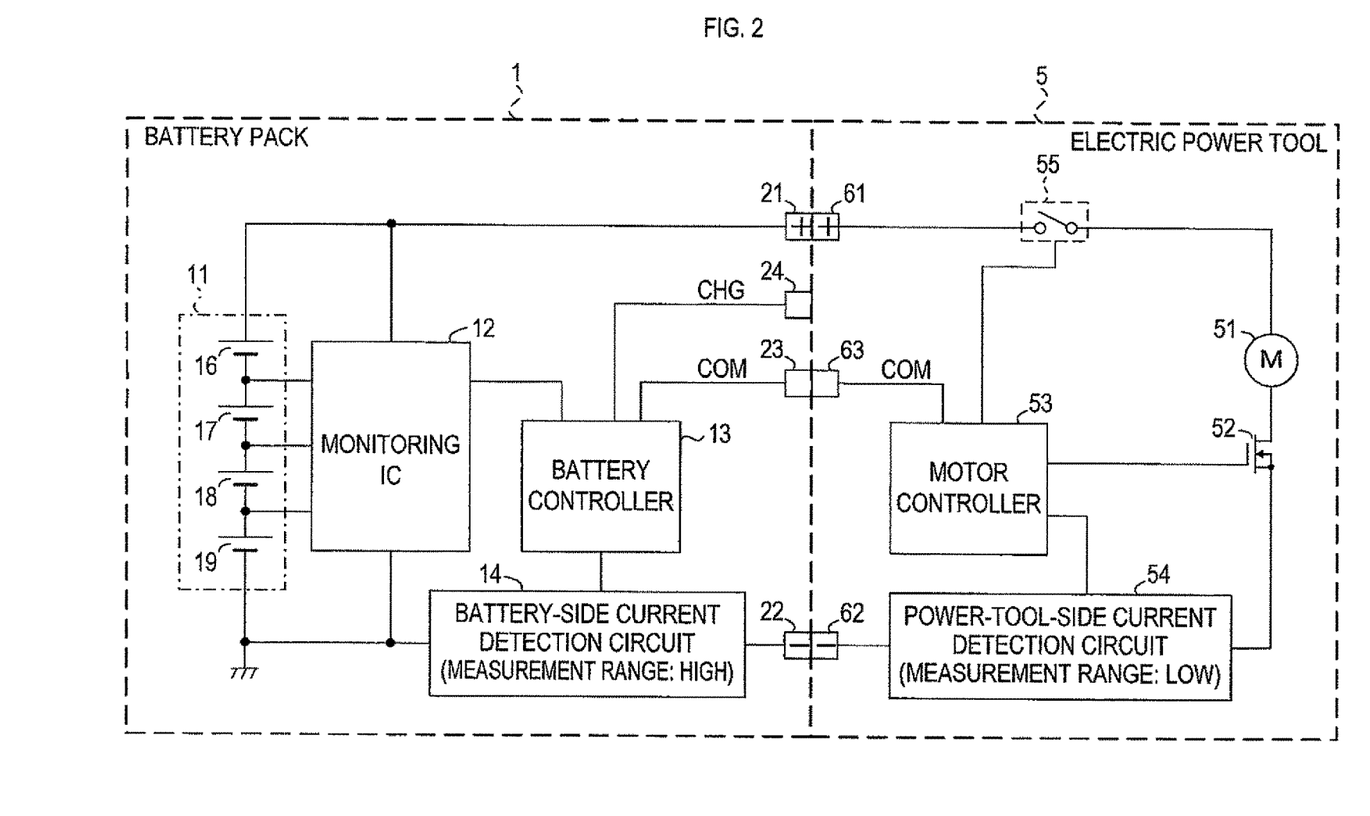
FIG. 2 is a configuration diagram showing a schematic configuration of the battery pack and an electric power tool of the present embodiment.

As shown in FIG. 2, the battery pack 1 is configured to be attachable to and detachable from an electric power tool 5. When being attached to the electric power tool 5, the battery pack 1 can operate the electric power tool 5 by supplying an electric power of the battery 11 to the electric power tool 5. FIG. 2 shows a state where the battery pack 1 is attached to the electric power tool 5 thereby to electrically connect the battery pack 1 and the electric power tool 5 to each other.

Hereinafter, specific configurations of the battery pack 1, the battery charger 3, and the electric power tool 5 will be described with reference to FIGS. 1 and 2.

The battery pack 1 is attachable to and detachable from the electric power tool 5 (see FIG. 2) as well as other various electric equipments (not shown), and is used as a power source for the electric power tool 5 and the various electric devices.

The battery pack 1 is, as shown in FIGS. 1 and 2, provided with the battery 11, a monitoring IC 12, a battery controller 13, a battery-side current detection circuit 14, a positive electrode terminal 21, a negative electrode terminal 22, a first signal terminal 23, and a second signal terminal 24.

The battery 11 is constituted of a plurality of (four in the present embodiment) battery cells 16 to 19 connected in series. Each of the battery cells 16 to 19 of the present embodiment is a lithium-ion rechargeable battery that generates a direct current (DC) voltage of 3.6 V on a standalone basis. Accordingly, the battery 11 as a whole generates a DC voltage of 14.4 V. The configuration of the battery 11 shown in FIG. 1 is merely one example, and a number, a connection state, a voltage, etc., of battery cells constituting the battery 11 should not be limited to the configuration in FIG. 1.

A positive electrode of the battery 11 (i.e., positive electrode of the battery cell 16 on a highest potential side) is connected to the positive electrode terminal 21. A negative electrode of the battery 11 (i.e., negative electrode of the battery cell 19 on a lowest potential side) is connected to the negative electrode terminal 22 via the battery-side current detection circuit 14.

The monitoring IC 12 is an integrated circuit (IC) for monitoring the battery 11. The monitoring IC 12 has functions, such as a function of detecting a voltage of the battery 11 to output the detected voltage to the battery controller 13, and a function of monitoring a voltage of each of the battery cells 16 to 19 of the battery 11 and, when at least one of the voltages of the battery cells 16 to 19 is in an overvoltage state, outputting to the battery controller 13 a signal (overvoltage signal) indicating generation of the overvoltage.

The battery-side current detection circuit 14 is provided in a current path extending from the negative electrode terminal 22 to the negative electrode of the battery 11. The battery-side current detection circuit 14 detects a value of an electric current flowing through this current path, i.e., a value of a charge current to be charged to the battery 11 and a value of a discharge current discharged from the battery 11.

The battery-side current detection circuit 14 of the present embodiment includes a shunt resistor provided in the current path extending from the negative electrode terminal 22 to the negative electrode of the battery 11. The battery-side current detection circuit 14 is configured to output a voltage between both ends of the shunt resistor, as a signal indicating a value of an electric current flowing through the shunt resistor, to the battery controller 13.

Used as the shunt resistor of the battery-side current detection circuit 14 is a resistor that has a resistance value relatively smaller than a resistance value of a shunt resistor of a battery-charger-side current detection circuit 34, which will be described later, and a resistance value of a shunt resistor of a power-tool-side current detection circuit 54 (see FIG. 2), which will be described later. Accordingly, measurement range of the battery-side current detection circuit 14 is relatively higher than measurement ranges of the battery-charger-side current detection circuit 34 and the power-tool-side current detection circuit 54.

More specifically, in the present embodiment, the battery-side current detection circuit 14 of the battery pack 1 has a higher measurement range of about 100 A and is capable of detecting an electric current of up to 100 A. The reason why the battery-side current detection circuit 14 has the higher measurement range as described above is that, among various electric power tools to which the battery pack 1 can be attached, there exists a high-load (high output) electric power tool that operates by receiving a supply of an electric current of around 100 A at a maximum. In order to allow detection of such a large electric current, the measurement range of the battery-side current detection circuit 14 is set to be high.

On the other hand, the battery-charger-side current detection circuit 34 of the battery charger 3 and the power-tool-side current detection circuit 54 of the electric power tool 5 have the respective measurement ranges that are low and about 10 A. The reason why the battery-charger-side current detection circuit 34 has the low measurement range as described above is that a value of a charge current used to charge the battery pack 1 from the battery charger 3 is around 10 A at most.

Although detailed explanations will be given later, the battery pack 1 is configured to calculate a value of a remaining battery capacity of the battery 11, based on a value of the discharge current from the battery 11 and a value of the charge current to the battery 11. Therefore, the battery pack 1 is configured to calculate a value of a discharge capacity during discharge by using a detection result by the battery-side current detection circuit 14 provided in the battery pack 1. Moreover, the battery pack 1 is configured to calculate a value of a charge capacity during charge by using a detection result by the battery-charger-side current detection circuit 34 provided in the battery charger 3.

It is also possible to detect a charge current during charge by the battery-side current detection circuit 14 of the battery pack 1. Therefore, the battery pack 1 can also calculate a value of the charge capacity during charge by using the detection result by the battery-side current detection circuit 14 provided in the battery pack 1.

However, as described above, the measurement range of the battery-side current detection circuit 14 is high and about 100 A. Thus, if a low electric current of about 10 A is detected by the detection circuit having such a high measurement range, it would be difficult to obtain a highly accurate detection result. Consequently, it is difficult to calculate the value of the charge capacity with high accuracy, resulting in difficulty of calculating the value of the remaining battery capacity of the battery 11 with high accuracy.

In view of the above, in the present embodiment, the battery-charger-side current detection circuit 34 having the low measurement range is provided in the battery charger 3 so that the value of the charge current during charge can be detected with high accuracy in the battery-charger-side current detection circuit 34. The battery pack 1 is configured to obtain a detection result by the battery-charger-side current detection circuit 34 during charge (specifically, by obtaining a time-integrated value of the detection results) to calculate the value of the charge capacity.

Moreover, compared with various electric power tools to which the battery pack 1 can be attached, the electric power tool 5 (see FIG. 2) of the present embodiment has a smaller rated current. In this electric power tool 5, a value of an electric current supplied from the battery pack 1 during operation is about 10 A at most, which is substantially the same as the value of the charge current. Thus, in a case where the battery pack 1 is attached to the electric power tool 5 to operate the electric power tool 5, if a smaller discharge current to the electric power tool 5 is detected by the battery-side current detection circuit 14 of the battery pack 1, the same problem as that described with respect to the charge current (i.e., deterioration of detection accuracy) arises.

In view of the above, in the present embodiment, the power-tool-side current detection circuit 54 having the lower measurement range is provided in the electric power tool 5 having a smaller rated power, so that a value of a discharge current to the electric power tool 5 is detected with high accuracy by this power-tool-side current detection circuit 54. Moreover, it is configured such that the battery pack 1 obtains a detection result by the power-tool-side current detection circuit 54 during discharge to the electric power tool 5 (specifically, obtain a time-integrated value of the detection results) to calculate the value of the charge capacity. Here, specific numerical values of each of the aforementioned electric currents and each of the measurement ranges are merely one example.

The battery controller 13 has various functions including a function of obtaining a voltage of the battery 11 from the monitoring IC 12 to monitor a battery voltage, a function of performing a predetermined protection operation when the overvoltage signal has been inputted from the monitoring IC 12, and a remaining-battery-capacity calculation function that calculates a value of the remaining battery capacity of the battery 11.

In the present embodiment, the battery controller, 13 is constituted of a microcomputer. However, the battery controller 13 may be constituted in various forms, for example, may be constituted of an IC (control IC) formed of various logic circuits, etc. A charge controller 33 and a motor controller 53, both of which will be described later, may be constituted in various forms in the same manner as in the battery controller 13.

The battery controller 13 is connected to the first signal terminal 23 and is configured to be capable of performing data communication with the battery charger 3 and the electric power tool 5 via the first signal terminal 23. That is to say, when the battery pack 1 is attached to the battery charger 3, the first signal terminal 23 of the battery pack 1 is connected to a first signal terminal 43 of the battery charger 3, thereby allowing data communication with the charge controller 33 of the battery charger 3. As a result, the battery controller 13 can obtain a value of the charge capacity from the charge controller 33.

The battery controller 13 is also connected to the second signal terminal 24. It is configured such that, through this second signal terminal 24, a battery-charger connection signal CHG (voltage: Vdd) can be inputted to, the battery controller 13 from the battery charger 3. That is, when the battery pack 1 is attached to the battery charger 3, the second signal terminal 24 of the battery pack 1 is connected to a second signal terminal 44 of the battery charger 3. Thus, when a control voltage Vdd is generated in the battery charger 3, the control voltage Vdd is inputted as the battery-charger connection signal CHG to the battery controller 13. The battery controller 13 can detect whether or not connection to the battery charger 3 is established based on whether or not the battery-charger connection signal CHG has been inputted.

Although the remaining-battery-capacity calculation function provided in the battery controller 13 will be described later in detail with reference to FIGS. 3 to 5, a brief overview thereof is as follows. The battery controller 13 performs time-integration of (i.e., integrates) the value of the electric current detected by and inputted from the battery-side current detection circuit 14, thereby calculating an amount of change in a capacity of the battery 11.

In the present embodiment, it is configured such that, while charging from the battery charger 3 is performed, the value of the charge capacity is inputted to the battery controller 13 from the battery charger 3 by data communication. Therefore, with respect to a capacity of a charge to be charged to the battery 11 during charge, the battery controller 13 obtains the value of the charge capacity, which is received from the battery charger 3, and uses the obtained value to calculate a value of the remaining battery capacity.

Accordingly, basically, during discharge, the battery controller 13 performs time-integration of the value of the electric current (discharge current) detected by the battery-side current detection circuit 14, thereby calculating a value of the discharge capacity; on the other hand, during charge, the battery controller 13 obtains the value of the charge capacity transmitted from the battery charger 3. This value of the charge capacity is a value calculated by the charge controller 33 based on a value of the electric current (a charge current value) detected by the battery-charger-side current detection circuit 34. Then, the battery controller 13 calculates a value of the remaining battery capacity of the battery 11, for example, by deducting the value of the discharge capacity from or adding the value of the charge capacity to a value of the charge capacity (a fully-charged capacity value) of the battery 11 in a fully-charged state.

However, since the electric power tool 5 shown in FIG. 2 has a small rated power, the electric power tool 5 is configured to calculate a value of the discharge capacity by the electric power tool 5 itself and transmit the calculated value of the discharge capacity to the battery pack 1. Therefore, when the battery pack 1 is connected to the electric power tool 5 and supplies an electric power to the electric power tool 5, the battery pack 1 obtains the value of the discharge capacity transmitted from the electric power tool 5 to calculate a value of the remaining battery capacity.

The battery pack 1 is further provided with a power supply circuit, which is not shown. The power supply circuit is configured to lower a voltage of the battery 11 to generate a control voltage having a predetermined voltage value. The Monitoring IC 12 and the battery controller 13 are operated by this control voltage.

Next, the battery charger 3 will be described. The battery charger 3 is, as shown in FIG. 1, provided with an input rectifier circuit 31, a charging switching power supply circuit 32, the charge controller 33, the battery-charger-side current detection circuit 34, a voltage detection circuit 35, a control power generation circuit 36, a positive electrode terminal 41, a negative electrode terminal 42, the first signal terminal 43, and the second signal terminal 44.

The input rectifier circuit 31 rectifies an alternate voltage supplied from an alternating current (AC) power source such as a commercial power source. Such a rectified output is outputted to the charging switching power supply circuit 32 and the control power generation circuit 36.

The charging switching power supply circuit 32 is a switching power supply circuit that generates a direct-current charging power to be charged to the battery 11 based on an output from the input rectifier circuit 31. The charging switching power supply circuit 32 is drive-controlled by the charge controller 33.

The battery-charger-side current detection circuit 34 is provided in a current path extending from the negative electrode terminal 42 to a negative terminal among positive and negative output terminals (not shown) of the charging switching power supply circuit 32. The battery-charger-side current detection circuit 34 detects a value of an electric current flowing through this current path, i.e., a value of a charge current to be charged to the battery 11.

The battery-charger-side current detection circuit 34 of the present embodiment includes a shunt resistor provided in the current path extending from the negative electrode terminal 42 to the negative terminal of the charging switching power supply circuit 32. The battery-charger-side current detection circuit 34 is configured to output a voltage between both ends of the shunt resistor, as a signal indicating a value of an electric current flowing through the shunt resistor, to the charge controller 33.

The value of the charge current used to charge the battery by the battery charger 3 of the present embodiment is, as described above, around 10 A at most. Thus, the shunt resistor of the battery-charger-side current detection circuit 34 has a resistance value relatively greater than the resistance value of the shunt resistor of the battery-side current detection circuit 14 in the battery pack 1. That is to say, the measurement range of the battery-charger-side current detection circuit 34 is relatively lower than the measurement range of the battery-side current detection circuit 14 and is, for example, about 10 A in the present embodiment.

The voltage detection circuit 35 detects a value of the voltage (battery voltage) of the battery 11 in the battery pack 1 and inputs a signal indicating the value of the detected battery voltage to the charge controller 33.

The control power generation circuit 36 is a switching power supply circuit that generates a predetermined control voltage Vdd (for example, DC 3.3 V) based on an output from the input rectifier circuit 31. The control voltage Vdd generated by the control power generation circuit 36 is used as a power source for operating the charge controller 33; in addition, when the battery pack 1 is attached to the battery charger 3, the control voltage Vdd generated by the control power generation circuit 36 is outputted from the second signal terminal 44 to the battery pack 1, as the battery-charger connection signal CHG.

In the present embodiment, the charge controller 33 is constituted of a microcomputer as in the battery controller 13 inside the battery pack 1. The charge controller 33 drive-controls the charging switching power supply circuit 32, based on various information received from the battery controller 13 in the battery pack 1 by data communication or based on the value of the battery voltage detected by the voltage detection circuit 35, thereby controlling a charge pattern (charge current, charge voltage, etc.) to the battery 11.

Moreover, the charge controller 33 performs time-integration of (i.e., integrates) the value of the electric current (charge current) detected by the battery-charger-side current detection circuit 34 for each predetermined period of time, thereby calculating a value of the charge capacity that has been charged to the battery 11 for the predetermined period of time. The charge controller 33 then transmits the calculated value of the charge capacity from the first signal terminal 43 to the battery pack 1.

Next, the electric power tool 5 will be described. The electric power tool 5 includes, as shown in FIG. 2, a motor 51, a drive switching element 52, the motor controller 53, the power-tool-side current detection circuit 54, a trigger switch 55, a positive electrode terminal 61, a negative electrode terminal 62, and a signal terminal 63.

The positive electrode terminal 61 is connected to one end of the motor 51 via the trigger switch 55. The negative electrode terminal 62 is connected to the other end of the motor 51 via the power-tool-side current detection circuit 54 and the drive switching element 52.

The motor 51 of the present embodiment is a brushed direct current (DC) motor. Moreover, the motor 51 of the present embodiment has a small rated power, and a value of an electric current during operation of the motor 51 is around 10 A at most. Among various electric power tools that are used with the battery pack 1 attached thereto, some of the electric power tools have a large rated power and a value of an electric current during operation thereof reaches around 100 A at a maximum. Comparing with the some of the electric power tools, the electric power tool 5 of the present embodiment is considered to be an electric power tool having a smaller rated power.

The trigger switch 55 is turned on and off when a user operates a trigger, which is not shown, provided in the electric power tool 5. Specifically, the trigger switch 55 is turned on when the user pulls the trigger, while the trigger switch 55 is turned off when the user releases the trigger. Information on on-and-off states of the trigger switch 55 is inputted to the motor controller 53.

When the trigger switch 55 is turned on the motor controller 53 turns on the drive switching element 52 to start conduction of electric current from the battery pack 1 to the motor 51, thereby operating the motor 51. When the trigger switch 55 is turned off, the motor controller 53 turns off the drive switching element 52 to interrupt the conduction of electric current to the motor 51. Here, the drive switching element 52 is an N-channel MOSFET in the present embodiment; however, this is merely one example.

The power-tool-side current detection circuit 54 is provided in a current path extending from the negative electrode terminal 62 to the drive switching element 52. The power-tool-side current detection circuit 54 detects a value of an electric current flowing through this current path, i.e., a value of a discharge current discharged from the battery 11 to the motor 51.

The power-tool-side current detection circuit 54 of the present embodiment includes a shunt resistor provided in the current path extending from the negative electrode terminal 62 to the drive switching element 52. The power-tool-side current detection circuit 54 is configured to output a voltage between both ends of the shunt resistor, as a signal indicating a value of an electric current flowing through the shunt resistor, to the motor controller 53.

The value of the discharge current when the electric power tool 5 in the present embodiment is operated is, as described above, around 10 A at most. Thus, the shunt resistor of the power-tool-side current detection circuit 54 has a resistance value relatively greater than the resistance value of the shunt resistor of the battery-side current detection circuit 14 in the battery pack 1. That is to say, the measurement range of the power-tool-side current detection circuit 54 is relatively lower than the measurement range of the battery-side current detection circuit 14 and is, for example, about 10 A in the present embodiment.

The motor controller 53 performs time-integration of (i.e., integrates) the value of the electric current (discharge current) detected by the power-tool-side current detection circuit 54 for each predetermined period of time, thereby calculating a value of the discharge capacity that has been discharged from the battery 11 for the predetermined period of time. Then, the motor controller 53 transmits the calculated value of the discharge capacity from the signal terminal 63 to the battery pack 1.

Next, the remaining-battery-capacity calculation function provided in the battery controller 13 of the battery pack 1 will be described in more detail with reference to flowcharts in FIGS. 3 to 5.

Figure 3:
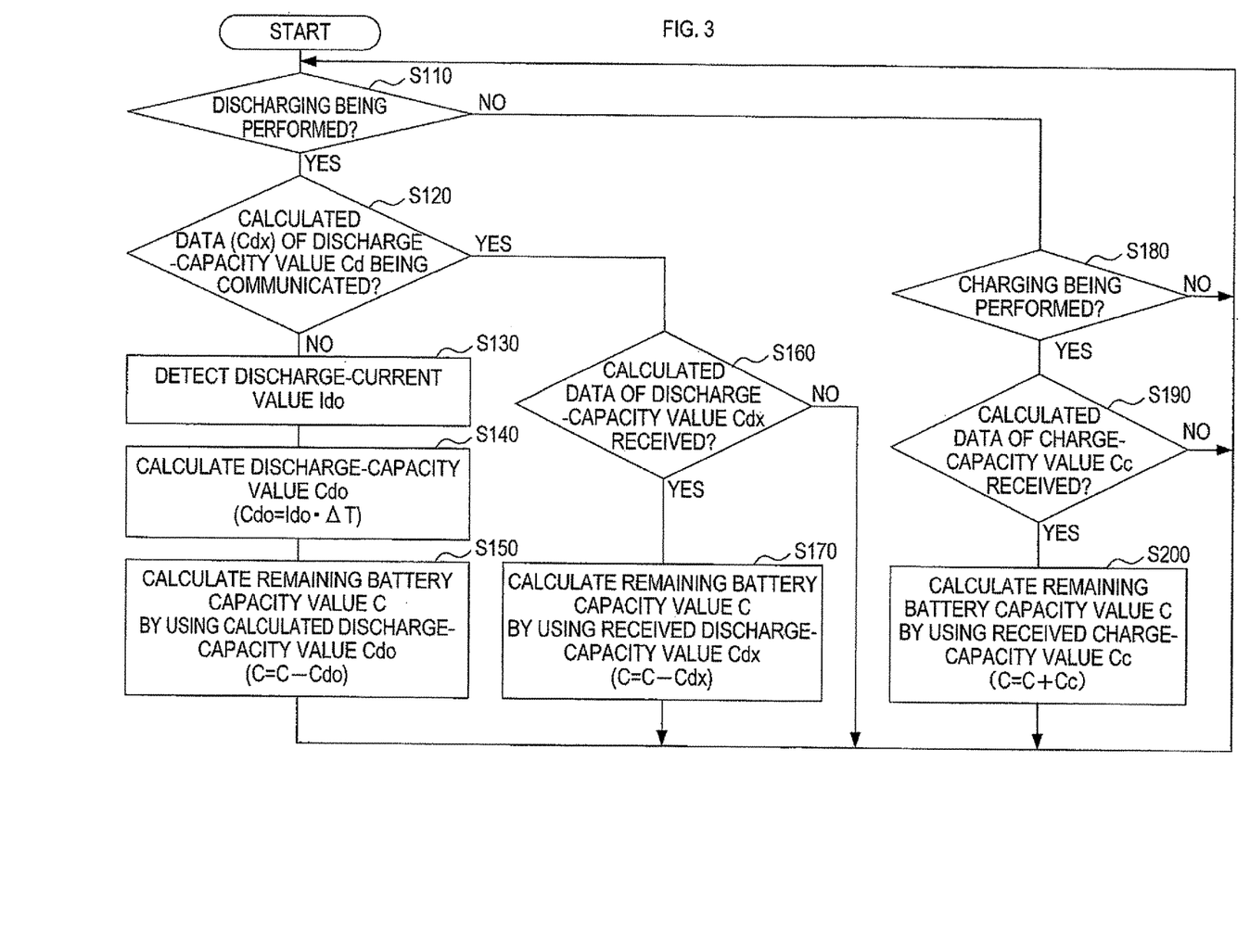
FIG. 3 is a flowchart showing a remaining-battery-capacity calculation process executed by a battery controller of the battery pack.

FIG. 3 shows a remaining-battery-capacity calculation process that is executed by the battery controller 13 to calculate a value of the remaining battery capacity of the battery 11. Before describing this remaining-battery-capacity calculation process, a charge-capacity transmission process to be executed in the battery charger 3 and a discharge-capacity transmission process to be executed in the electric power tool 5 will be described.

First, explanations will be given with respect to the charge-capacity transmission process executed by the charge controller 33 in the battery charger 3, with reference to FIG. 4.

Figure 4:
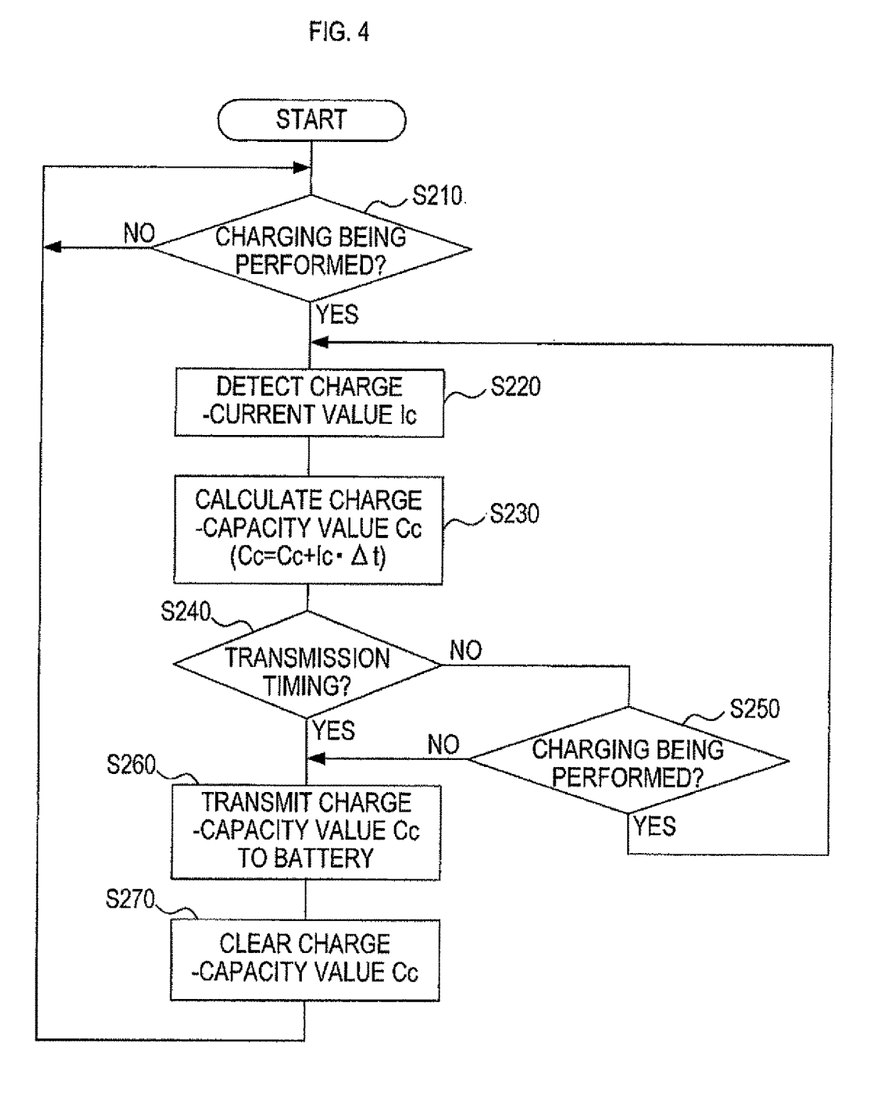
FIG. 4 is a flowchart showing a charge-capacity transmission process executed by a charge controller of the battery charger.

In a memory (not shown) provided in the charge controller 33, a program for the charge-capacity transmission process in FIG. 4 is stored. When a CPU (not shown) provided in the charge controller 33 starts operating by receiving a supply of the control voltage Vdd, the CPU executes the charge-capacity transmission process in FIG. 4.

When the charge-capacity transmission process in FIG. 4 is started, first in S210, the charge controller 33 determines whether or not charging of the battery 11 is being performed. Since the charge controller 33 has a basic function of controlling charging to the battery 11, understandably, the charge controller 33 itself can determine whether or not charging is being performed.

While charging is not performed (S210: NO), this determination process of S210 is repeatedly performed. On the other hand, if charging is being performed (S210: YES), in S220, a charge-current value Ic is detected. Specifically, a detection result of an electric current is obtained from the battery-charger-side current detection circuit 34. Based on this detection result, the charge-current value Ic is detected.

Then, in S230, a charge-capacity value Cc is calculated. During charge, this process of S230 is performed each time a predetermined time interval Δt has elapsed. The charge-capacity value Cc is calculated in S230 by the following formula (1).

$$Cc=Cc+Ic \cdot \Delta t \qquad (1)$$

That is, each time the time interval Δt has elapsed, the charge-capacity value Cc calculated at the current time interval Δt is added in a cumulative manner (i.e., time-integrated) to the charge-capacity value Cc calculated at the previous time interval Δt.

Then, in S240, it is determined whether or not a transmission timing has been reached. The transmission timing is a timing that is reached in a predetermined cycle, which is at least greater than the aforementioned Δt (for example, tens to several hundreds of times of Δt).

If the transmission timing has not been reached (S240: NO), it is determined in S250 whether or not charging is being performed. When charging is being performed, the process returns to S220. In other words, while charging is performed, the calculations in S220 and S230 are repeated until the transmission timing has been reached, thereby time-integrating the charge-capacity value Cc.

If the transmission timing has been reached (S240: YES) or if charging is stopped although the transmission timing has not yet been reached (S250: NO), in S260, the charge-capacity value Cc that is currently calculated is transmitted to the battery pack 1. In S270, the currently calculated charge-capacity value Cc is set to "0" and thereafter, the process returns to S210.

Next, the discharge-capacity transmission process executed by the motor controller 53 of the electric power tool 5 will be described with reference to FIG. 5.

Figure 5:
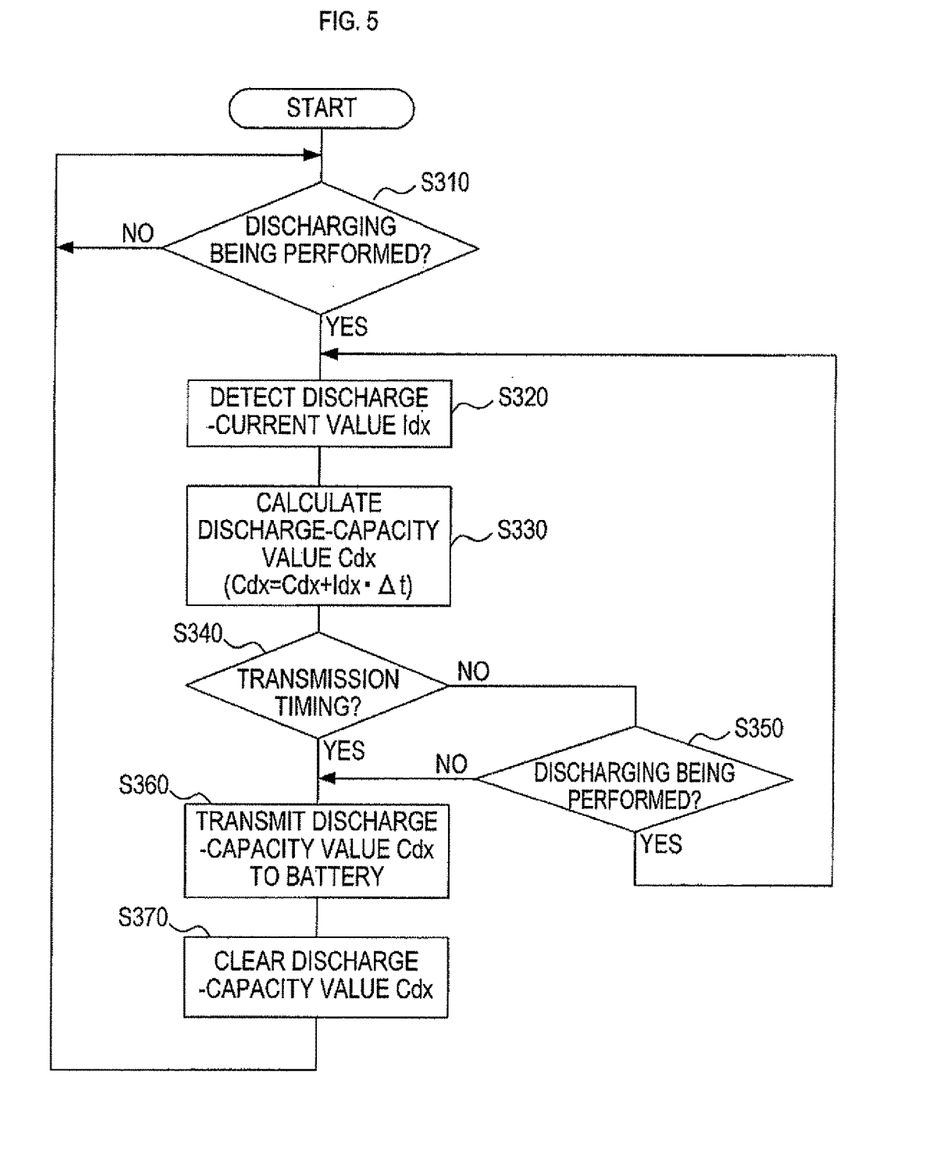
FIG. 5 is a flowchart showing a discharge-capacity transmission process executed by a motor controller of the electric power tool.

In a memory (not shown) provided in the motor controller 53, a program for the discharge-capacity transmission process in FIG. 5 is stored. When a CPU (not shown) provided in the motor controller 53 starts operating, the CPU executes the discharge-capacity transmission process in FIG. 5.

When the discharge-capacity transmission process in FIG. 5 is started, first in S310, the motor controller 53 determines whether or not discharging is being performed, i.e., whether or not discharging from the battery pack 1 to the motor 51 is being performed. This determination can be performed, for example, based on a detection result by the power-tool-side, current detection circuit 54 or based on whether or not the trigger switch 55 is turned on.

While discharging is not performed (S310: NO), this determination process in S310 is repeatedly performed. On the other hand, if discharging is being performed (S310: YES), in S320, a discharge-current value Idx is detected. Specifically, a detection result of an electric current is obtained from the power-tool-side current detection circuit 54. Based on the detection result, the discharge-current value Idx is detected.

Then, in S330, a discharge-capacity value Cdx is calculated. During discharge, this process of S330 is performed each time a predetermined time interval Δt has elapsed. The discharge-capacity value Cdx is calculated in S330 by the following formula (2).

$$Cdx=Cdx+Idx \cdot \Delta t \qquad (2)$$

That is, in the same manner as in the process of S230 in FIG. 4 in the battery charger 3, each time the time interval Δt has elapsed, the discharge-capacity value Cdx calculated at the current time interval Δt is added in a cumulative manner (i.e., time-integrated) to the discharge-capacity value Cdx calculated at the previous time interval Δt.

Then, in S340, it is determined whether or not a transmission timing has been reached. In the same manner as in the process of S240 in FIG. 4 in the battery charger 3, the transmission timing is a timing that is reached in a predetermined cycle, which is at least greater than the aforementioned Δt (for example, tens to several hundreds of times of Δt).

If the transmission timing has not been reached (S340: NO), it is determined in S350 whether or not discharging is being performed. When discharging is being performed, the process returns to S320. In other words, while discharging is performed, the calculations in S320 and S330 are repeated until the transmission timing has been reached, thereby time-integrating the discharge-capacity value Cdx.

If the transmission timing has been reached (S340: YES) or if discharging is stopped although the transmission timing has not yet been reached (S350: NO), in S360, the discharge-capacity value Cdx that is currently calculated is transmitted to the battery pack 1. In S370, the currently calculated discharge-capacity value Cdx is set to "0" and thereafter, the process returns to S310.

Next, the remaining-battery-capacity calculation process executed by the battery controller 13 in the battery pack 1 will be described with reference to FIG. 3.

In a memory (not shown) provided in the battery controller 13, a program for the remaining-battery-capacity calculation process in FIG. 3 is stored. When a CPU (not shown) provided in the battery controller 13 starts operating, the CPU executes the remaining-battery-capacity calculation process in FIG. 3.

When the remaining-battery-capacity calculation process in FIG. 3 is started, first in S110, the battery controller 13 determines whether or not discharging is being performed, i.e., whether or not discharging is being performed from the battery 11. This determination can be performed, for example, based on a detection result by the battery-side current detection circuit 14, contents of communication between the battery controller 13 and other external microcomputers, or presence or absence of the battery-charger connection signal CHG from the battery charger 3.

While discharging is not performed (S110: NO), it is determined in S180 whether or not charging is being performed, i.e., whether or not charging of the battery 11 is being performed by the battery charger 3. This determination can be performed in the same manner as in S110.

If charging is not being performed (S180: NO), the process returns to S110. If charging is being performed (S180: YES), it is determined in S190 whether or not calculated data of the charge-capacity value Cc has been received from the battery charger 3. If the calculated data of the charge-capacity value Cc has not been received (S190: NO), the process returns to S110. If the calculated data of the charge-capacity value Cc has been transmitted from the battery charger 3 and this transmitted calculated data has been received (S190: YES), in S200, a remaining battery capacity value C of the battery 11 is calculated. Specifically, the remaining battery capacity value C is calculated by the following formula (3).

$$C=C+Cc \qquad (3)$$

That is, by adding the newly received charge-capacity value Cc to the current remaining battery capacity value C, the remaining battery capacity value C is updated. Here, an initial value of the remaining battery capacity value C may be set, for example, such that a remaining battery capacity at a time of manufacturing of the battery pack 1 is measured and such a measured value is set as an initial value of the remaining battery capacity value C. Alternatively, each time the battery 11 is charged by the battery charger 3 to reach a predetermined capacity (e.g., a fully charged state), a value of the capacity at such a time may be set as an initial value of the remaining battery capacity value C. After the remaining battery capacity value C is calculated in S200, the process returns to S110.

On the other hand, if it is determined in S110 that discharging is being performed (S110: YES), it is determined in S120 whether or not calculated data (Cdx) of a discharge-capacity value Cd is being communicated.

The electric power tool 5 of the present embodiment has a function in which the electric power tool 5 itself calculates a discharge-capacity value Cdx and transmits the calculated discharge-capacity value Cdx to the battery pack 1. Therefore, when the battery pack 1 is attached to the electric power tool 5, a predetermined communication process is executed between the battery controller 13 and the motor controller 53. Then, the battery controller 13 makes a preparation for receiving the discharge-capacity value Cdx from the electric power tool 5, while the motor controller 53 of the electric power tool 5 makes a preparation for transmitting the calculated data of the discharge-capacity value Cdx.

As described above, when the battery controller 13 makes the preparation for receiving the discharge-capacity value Cdx from an external device by communicating with a device to be connected, the battery controller 13 determines in S120 that the communication is being performed (S120: YES) (i.e., the discharge-capacity value Cdx is to be supplied from the external device). Then, the process proceeds to S160.

In S160, it is determined whether or not the calculated data of the discharge-capacity value Cdx has been received from the external device (e.g., the electric power tool 5, etc.). If the calculated data of the discharge-capacity value Cdx is not received (S160; NO), the process returns to S110. If, for example, when the battery pack 1 is attached to the electric power tool 5, the calculated data of the discharge-capacity value Cdx has been transmitted from the electric power tool 5 and then received (S160: YES), in S170, a remaining battery capacity value C of the battery 11 is calculated. Specifically, the remaining battery capacity value C is calculated by the following formula (4).

$$C=C-Cdx \quad (4)$$

That is, by deducting the newly received discharge-capacity value Cdx from the current remaining battery capacity value C, the remaining battery capacity value C is updated. After the remaining battery capacity value C is calculated in S170, the process returns to S110.

On the other hand, if it is determined in S120 that the communication of the calculated data Cdx of the discharge-capacity value Cd is not being performed (S120: NO), the process proceeds to S130 to calculate the discharge-capacity value Cd by the battery controller 13 itself. In S130, a discharge-current value Ido is detected. Specifically, a detection result of an electric current is obtained from the battery-side current detection circuit 14. Based on the detection result, the discharge-current value Ido is detected.

Then, in S140, a discharge-capacity value Cdo is calculated. During discharge, this process of S140 is performed each time a predetermined time interval Δt has elapsed. The discharge-capacity value Cdo is calculated, in S140 by the following formula (5).

$$Cdo=Ido \cdot \Delta t \quad (5)$$

Then, in S150, the calculated discharge-capacity value Cdo is used to calculate a remaining battery capacity value C. Specifically, the remaining battery capacity value C is calculated by the following formula (6).

$$C=C-Cdo \quad (6)$$

That is, by deducting the calculated discharge-capacity value Cdo between the previous time interval Δt and the current time interval Δt, from the current remaining battery capacity value C, the remaining battery capacity value C is updated. After the remaining battery capacity value C is calculated in S150, the process returns to S110.

As described above, the battery pack 1 of the present embodiment performs calculation of the remaining battery capacity value C basically as follows: during discharge, the battery controller 13 calculates the remaining battery capacity value C by using the discharge-capacity value Cdo detected and calculated by the battery controller 13 itself, and during charge, the battery controller 13 calculates the remaining battery capacity value C by using the charge-capacity value Cc received from the battery charger 3.

However, as in the electric power tool 5 of the present embodiment shown in FIG. 2, if the battery controller 13 is connected to an equipment, etc. configured to detect and calculate the discharge-capacity value Cdx so as to transmit such a discharge-capacity value Cdx to the battery pack 1, the battery controller 13 calculates the remaining battery capacity value C by using the discharge-capacity value Cdx received from the equipment, etc.

The measurement range of the battery-side current detection circuit 14 in the battery pack 1 is set to have a relatively high value (about 100 A in the present embodiment). This is because there may be a case where a large electric current flows from the battery pack 1 depending on an electric power tool to which the battery pack 1 is to be connected. For this reason, if a value of the electric current is small, such as the charge current from the battery charger 3 and the discharge current to the electric power tool 5, it is difficult to accurately detect such a small value of the electric current.

In view of the above, in the battery charger 3 and the electric power tool 5, the respective current detection circuits having the lower measurement ranges (about 10 A in the present embodiment) are provided. The value of the charge current from the battery charger 3 is detected by the battery-charger-side current detection circuit 34 that has the low measurement range and that is provided in the battery charger 3. Based on this detected value of the charge current, the charge controller 33 calculates a value of the charge capacity.

Moreover, with respect to the discharge current to the electric power tool 5, the value of the discharge current is detected by the power-tool-side current detection circuit 54 that has the low measurement range and that is provided in the electric power tool 5. Based on this detected value of the discharge current, the motor controller 53 calculates a value of the discharge capacity.

As above, both of the value of the charge capacity calculated by the battery charger 3 and the value of the discharge capacity calculated by the electric power tool 5 are highly accurate.

In this way, with the simple configuration in which the respective current detection circuits having the lower measurement ranges are provided in the battery charger 3 and the electric power tool 5 so as to obtain calculated results of respective values of the charge capacity and discharge capacity from the respective current detection circuits by data communication, it can be achieved to calculate the remaining battery capacity value C of the battery 11 with high accuracy by the battery controller 13.

That is to say, even if the electric current flowing through the battery 11 varies over a great range, it is possible to detect a value of such an electric current with high accuracy. Moreover, based on the detected value of the electric current, it is possible to calculate a value of the discharge capacity or a value of the charge capacity with high accuracy. Consequently, the remaining battery capacity value C can be calculated with high accuracy.

Moreover, when the battery controller 13 calculates the remaining battery capacity value C of the battery 11, it is not absolutely necessary that a calculated result of the value of the charge capacity is transmitted to the battery controller 13 from the battery charger 3. It may be possible that data of the value of the charge current detected in the battery charger 3 is transmitted to the battery controller 13 so that the battery controller 13 can calculate a value of the charge capacity by using the transmitted data.

Likewise, in the electric power tool 5, it is not absolutely necessary that a calculated result of the value of the discharge capacity is transmitted to the battery controller 13 from the electric power tool 5. It may be possible that data of the value of the discharge current detected in the electric power tool 5 is transmitted to the battery controller 13 so that the battery controller 13 can calculate a value of the discharge capacity by using the transmitted data.

However, in the aforementioned configuration, the battery controller 13 needs to repeatedly obtain electric current data in a short cycle to perform calculation (i.e., time-integration, etc.) of a value of the capacity, causing a frequent data communication, In this regard, in the present embodiment, transmitted from the battery charger 3 is, not a value of the charge current, but a value of the charge capacity calculated based on the value of the charge current. Moreover, transmitted from the electric power tool 5 is, not a value of the discharge current, but a value of the discharge capacity calculated based on the value of the discharge current. Therefore, in the present embodiment, it is possible to reduce frequency of data communication between the battery pack 1 and a connected device to which the battery pack 1 is connected.

Here, in the present embodiment, both the battery charger 3 and the electric power tool 5 correspond to an example of a connected device of the present invention; specifically, the electric power tool 5 corresponds to an example of an electric device of the present invention. The battery-side current detection circuit 14 corresponds to an example of a first detection device of the present invention. Both the battery-charger-side current detection circuit 34 and the power-tool-side current detection circuit 54 correspond to an example of a second detection device of the present invention. The battery controller 13 corresponds to an example of a measurement processing device and an example of a receiving device of the present invention. Each of the charge controller 33 and the motor controller 53 corresponds to an example of a transmission device and an example of an electric-current integration device of the present invention.

Each of the process in S230 in FIG. 4 and the process in S330 in FIG. 5 corresponds to an example of a process executed by the electric current integration device of the present invention. The processes in S150, S170, and S220 in FIG. 3 correspond to an example of a process executed by the measurement processing device of the present invention.

[Modification]

The embodiment of the present invention has been described as above. However, embodiments of the present invention should not at all be limited to the above-described embodiment. Needless to say, the present invention can be carried out in various forms without departing from the technical scope of the present invention.

For example, a physical quantity as a detection object is not limited to an electric current and may be any object that can be detected by both the battery pack 1 and a connected device to be connected to the battery pack 1. As a specific example, for instance, a value of the battery voltage may be transmitted from the battery pack 1 during charge.

When charging the battery 11, the charge controller 33 in the battery charger 3 performs a charge control while concurrently monitoring a voltage of the battery 11. In order to appropriately perform the charge control, the battery voltage needs to be detected with accuracy as high as possible. Since the battery charger 3 includes the voltage detection circuit 35 for detection of the battery voltage, it is, of course, possible to perform the charge control by using a detection result by the voltage detection circuit 35. Meanwhile, since the battery pack 1 of the present embodiment includes the monitoring IC 12, it is possible to detect the battery voltage by the monitoring IC 12 in a relatively highly accurate manner. Therefore, by transmitting a battery-voltage value detected by the monitoring IC 12 to the battery charger 3 by data communication, the charge controller 33 can perform the charge control with much higher accuracy.

Figure 6:
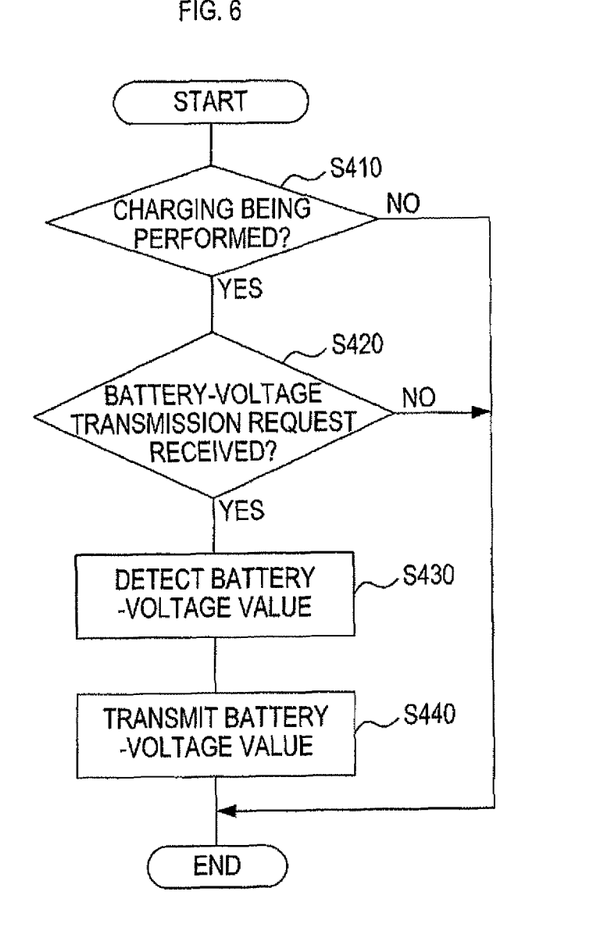
FIG. 6 is a flowchart showing a battery-voltage transmitting process executed by the battery controller of the battery pack.
Figure 7:
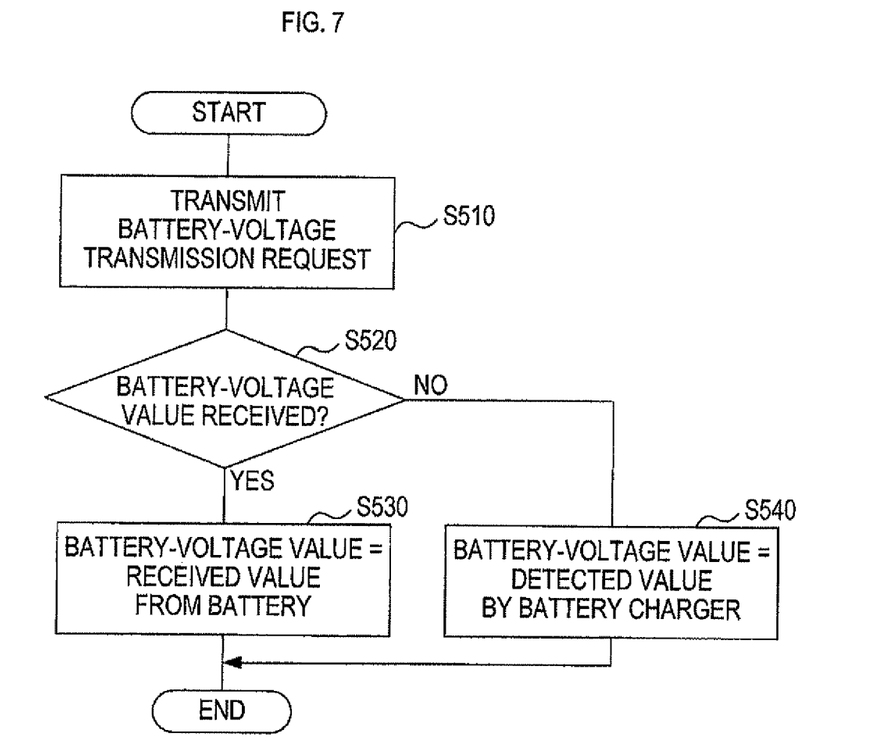
FIG. 7 is a flowchart showing a battery-voltage obtaining process executed by the charge controller of the battery charger.

With reference to FIGS. 6 and 7, explanations will be given with respect to respective processes executed by the controllers 13 and 33 in a case where the battery voltage value is configured to be transmitted to the battery charger 3 from the battery pack 1 in the above-described manner.

When a battery-voltage transmitting process in FIG. 6 is started, first in S410, the battery controller 13 of the battery pack 1 determines whether or not the battery 11 is being charged. If the battery 11 is not being charged, this battery-voltage transmitting process is terminated. However, if the battery 11 is being charged, it is determined in S420 whether or not a battery-voltage transmission request has been received from the battery charger 3 by data communication. If the battery-voltage transmission request has not been received from the battery charger 3, this battery-voltage transmitting process is terminated. However, if the battery-voltage transmission request has been received, in S430, a battery-voltage value is detected. Specifically, a detected result of the battery-voltage value is obtained from the monitoring IC 12. Then, in S440, the obtained battery-voltage value is transmitted to the battery charger 3.

When a battery-voltage obtaining process in FIG. 7 is started, first in S510, the charge controller 33 of the battery charger 3 transmits a battery-voltage transmission request to the battery pack 1 by data communication. Then, it is determined in S520 whether or not the battery-voltage value has been received from the battery pack 1.

If it is determined that the battery-voltage value has not been received, in S540, a battery-voltage value detected by the voltage detection circuit 35 in the battery charger 3 is obtained as a non-provisional battery-voltage value for control. On the other hand, if the battery-voltage value has been received from the battery pack 1, in S530, the received battery-voltage value is obtained as a non-provisional battery-voltage value for control.

The above-described battery voltage is merely one example. The present invention can be applied to other various physical quantities.

Moreover, the value of the electric current discharged from the battery 11 varies, depending on a connected device to which the battery pack 1 is connected or an operational state (load state) of the connected device. Therefore, transmission of a detection result (e.g., a discharge capacity, etc.) from the connected device may not be performed constantly as in the electric power tool 5 in the above-described embodiment, but may be performed as needed depending on a variation range of an electric current flowing through the connected device.

For example, it may be configured such that if a value of the discharge current is large, the battery controller 13 calculates a value of a remaining battery capacity by using a detection result of the battery-side current detection circuit 14 of the battery pack 1; on the other hand, if the value of the discharge current is small, the battery controller 13 sends a transmission request to the connected device (or, the connected device itself determines that the value of the discharge current has become smaller), so that data of the value of the discharge current or the value of the discharge capacity is transmitted to the battery controller 13 from the connected device.

Moreover, in the present embodiment, the battery controller 13 is configured to calculate by itself a value of the remaining battery capacity of the battery 11; however, it may be configured such that, depending on a physical quantity as a detection object, the connected device to which the battery pack 1 is to be connected performs, by the connected device itself, detection of the physical quantity or various calculation processes (measurement processes), etc., based on a result of this detection.

Furthermore, an application of the present invention is not limited to the configuration shown in FIG. 1 in which the battery pack 1 and the battery charger 3 are provided, and the configuration shown in FIG. 2 in which the battery pack 1 and the electric power tool 5 are provided. Rather, the present invention can be applied to a configuration in which the battery pack 1 and any connected device that can be connected (attached) to the battery pack 1 are provided. Examples of the connected device other than a battery charger are an electrical device, such as a rechargeable radio, an electrical operating machine, such as a rechargeable cleaner, and so on,

What is claimed is:

1. A measurement system comprising:
   a battery pack containing a battery; and
   at least one type of connected device to which the battery pack is to be connected,
   wherein the battery pack comprises a first detection device that is configured to detect a predetermined physical quantity in the battery pack and that has a predetermined measurement range,
   wherein the at least one type of connected device comprises a second detection device that is configured to detect a physical quantity and that has a measurement range different from the measurement range of the first detection device, wherein the physical quantity is the same as the predetermined physical quantity,
   wherein one of the battery pack and the at least one type of connected device is a first device, and the other of the battery pack and the at least one type of connected device is a second device, the first device comprising:
   a receiving device configured to receive a detection-value-related information that is transmitted from the second device and that directly or indirectly indicates a detection result by one of the first detection device and the second detection device; and
   a measurement processing device configured to (i) perform a predetermined measurement process by using the detection-value-related information received by the receiving device in a case where the receiving device receives the detection-value-related information and (ii) to perform the measurement process by using a detection result by one device of the first detection device and the second detection device in a case where the receiving device does not receive the detection-value-related information, the measurement process comprising calculation of a remaining battery capacity of the battery, and the one device being provided in the first device, and
   wherein the second device comprises a transmission device configured to transmit the detection-value-related information to the first device.

2. The measurement system according to claim 1,
   wherein the first detection device and the second detection device are configured to detect an electric current to be discharged from the battery or to be charged to the battery, as the physical quantity.

3. The measurement system according to claim 2,
   wherein the first detection device is configured to detect a value of the electric current in a predetermined first measurement range, and
   wherein the second detection device is configured to detect a value of the electric current in a predetermined second measurement range lower than the first measurement range.

4. The measurement system according to claim 3,
   wherein the at least one type of connected device comprises a battery charger that is configured to charge the battery, and
   wherein the measurement processing device is further configured (i) to perform the measurement process by using a detection result by the first detection device in a case where discharging of the battery is performed (ii) to perform the measurement process by using a detection result by the second detection device in a case where charging of the battery by the battery charger is performed.

5. The measurement system according to claim 4,
   wherein the battery pack comprises the receiving device and the measurement processing device, and
   wherein the battery charger comprises the transmission device.

6. The measurement system according to claim 2,
   wherein the at least one type of connected device comprises an electric device to be operated by an electric power of the battery,
   wherein the battery pack comprises the receiving device and the measurement processing device,
   wherein the electric device comprises the transmission device.

7. The measurement system according to claim 2,
   wherein the second device comprises an electric-current integration device configured to calculate an electric-current integration value by performing a time-integration of a value of an electric current detected by one of the first detection device and the second detection device, the one being provided in the second device, and wherein the transmission device is configured to transmit the electric-current integration value calculated by the electric-current integration device, as the detection-value-related information.

* * * * *